Jan. 24, 1956 C. E. PFUND 2,732,498
SERIES TUNED HIGH FREQUENCY OSCILLATORS
Filed Jan. 2, 1951
FIG. 1.
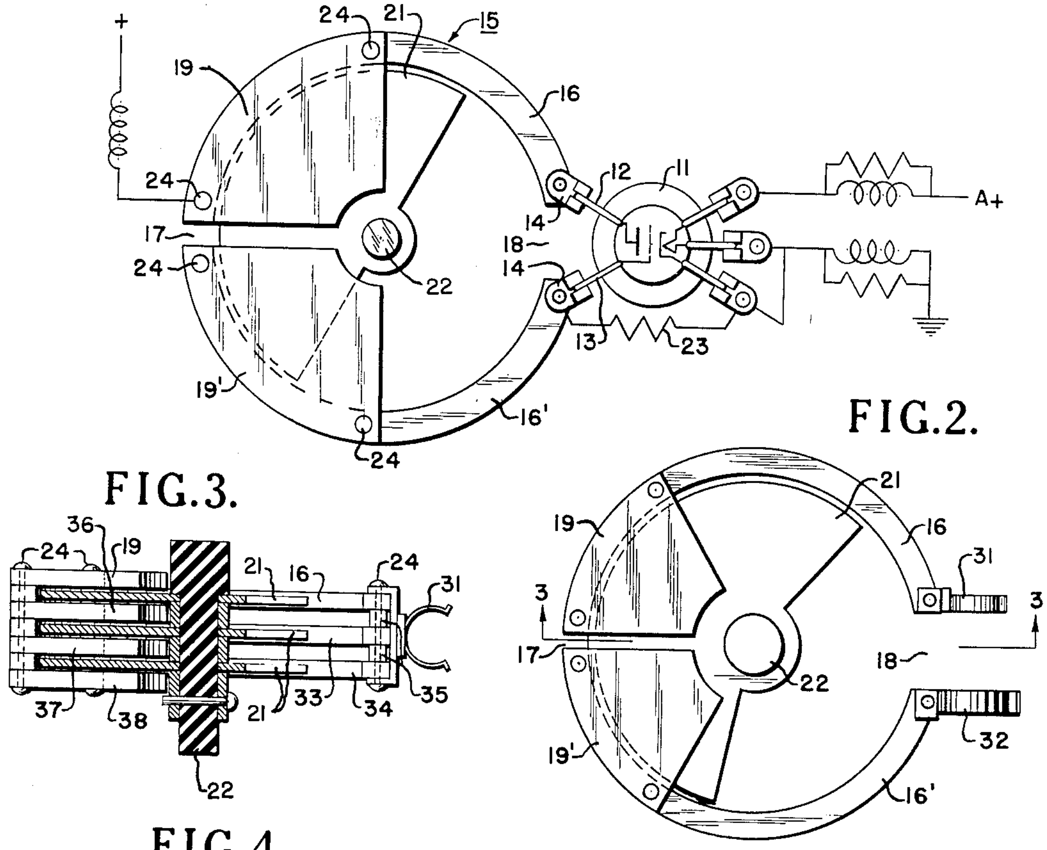
FIG. 2. FIG. 3.
FIG. 4.
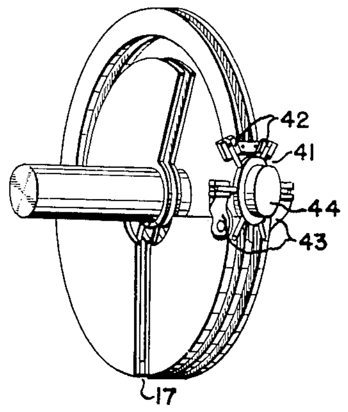
FIG. 5.
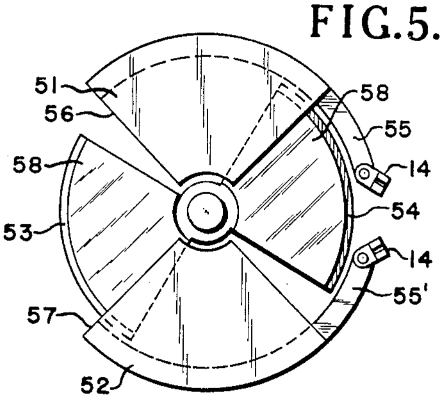
INVENTOR.
Charles E. Pfund 2,732,498
Patented Jan. 24, 1956

2,732,498

SERIES TUNED HIGH FREQUENCY OSCILLATORS

Charles E. Pfund, Takoma Park, Md., assignor to Development Engineering Service, Montgomery County, Md., a partnership Application January 2, 1951, Serial No. 203,927
20 Claims. (Cl. 250—36)

This invention relates to series-tuned oscillators and more particularly to a new and improved series-tuned oscillator provided with a unitary variable tuning circuit.

In prior art U. H. F. oscillators the modified Colpitts circuit is well known as a means of obtaining oscillations by connecting a parallel resonant circuit to a discharge device such, for example, as between the grid and the plate of a triode discharge device and utilizing the interelectrode capacitances of the tube to provide the required feedback. These oscillators suffer from an inherent limitation known as the self-resonant frequency of the tube, at which frequency the grid and plate lead inductances resonate with the interelectrode capacitances and determine the maximum frequency of oscillation for a given triode with an external parallel LC circuit.

In order to obtain oscillations both above and below the self-resonant frequency of a tube, it is well known to provide a series connected inductor and capacitor between the plate and grid of the tube, thereby to provide the requisite positive and negative reactance below and above the tube's self-resonant frequency respectively. A discussion of this circuit is given in an article entitled, "Ultra-High-Frequency Triode Oscillator Using a Series-Tuned Circuit," by J. M. Pettit, published in the Proceedings of the IRE for June 1950, pp. 633–635. Prior art devices of this type have conventionally been tuned by means of a variable capacitor or by ganging a variable capacitor with a variable inductor whereby the correct magnitude and sign of reactance is provided for a limited tuning range. Such prior art devices have not been entirely satisfactory in that only a limited tuning range can be obtained with a variable capacitor and because a variable inductor is difficult to construct at high frequencies without introducing spurious effects.

While series resonant circuits of the unitary inductance-capacitance variational type have been known in the prior art such, for example, as disclosed and claimed in U. S. Patent 2,471,705 to O. H. Schmitt, such devices have not been entirely satisfactory due to spurious responses which are present due to large stray capacitances and the difficulty of making low inductance connections to the terminals thereof thereby introducing further stray impedances. It will further be appreciated that these circuits, being series resonant, provide means for obtaining at the terminals minimum impedance characterized by zero reactance over a fixed range of frequencies; no teaching is found therein of a unitary LC variational series circuit utilized to supply a reactance-frequency function characterized by a negative slope and in which a large positive reactance is required at the low frequency end of the range, a large negative reactance at the high frequency end and a smooth continuous variation between these reactance values at all points intermediate the ends of the frequency range.

The present invention overcomes the aforementioned difficulties of the prior art by providing an oscillator with a unitary inductance-capacitance variational system of the series circuit type to establish the correct range of positive and negative reactance values for operation over a wide frequency range above and below the self-resonant frequency of the tube employed. This is achieved without any spurious resonances due to stray capacitive and stray inductive paths, the tuner terminals being contiguous with the tube electrodes thereby including these electrodes as an integral part of the R. F. circuit.

The oscillator this invention provides utilizes the unitary LC variational system to provide a relatively large inductance to obtain a desired low frequency limit; by virtue of the integral nature of the connection between the terminals of the tube and the tuner, the inductance added by the tuner to the tube terminals at the high frequency end of the tuning range is substantially eliminated. In this manner extremely high frequencies of operation can be realized due to the external circuit consisting of a small residual capacitance and substantially zero inductance. Elimination of external inductance is important since in the series-tuned circuit it adds directly to the inductance of the leads connecting to the discharge path of the tube which is not the case in an oscillator employing a parallel external LC circuit.

An object of this invention is to provide a variable frequency oscillator having a wide tuning range.

Another object of this invention is to provide an oscillator in which the impedance required for wide frequency range operation is supplied by a unitary inductance-capacitance variational system.

A further object of this invention is to provide a variable frequency oscillator having a series-tuned unitary tuning structure which includes the oscillator tube electrodes as an integral part of the tuning circuit.

Another object of this invention is to provide a unitary tuning structure which is well adapted for connection to the terminals of a tube, which is free of any spurious resonances due to stray capacitances or the like and does not require any sliding contacts.

A further object of this invention is to provide a series-tuned reactance which is well-adapted for connection to tubes of the "Acorn," and coplanar triode type to form a series-tuned oscillator.

A further object of this invention is to provide a unitary series inductance-capacitance variational circuit capable of satisfying a desired reactance-frequency function having negative slope over a wide frequency range.

Another object of this invention is to provide a series-tuned oscillator circuit in which a substantial inductance is realized at low frequencies and is substantially eliminated at high frequencies.

Other objects and the attendant advantages of the present invention will be more readily understood from the following detailed description and accompanying drawings wherein:

Fig. 1 is a plan view partly schematic of a unitary inductance-capacitance variational system oscillator using an "Acorn" type tube;

Fig. 2 is a view of a tuner of the present invention adapted for use with a lighthouse type coplanar triode in an oscillator circuit;

Fig. 3 is a view, partly in section, taken along the line 3—3 of Fig. 2 showing one construction of a tuner when stacked inductance strips and capacitor plates are used;

Fig. 4 is view of a modified form of the tuner with socket connections for a seven pin "Acorn" triode and;

Fig. 5 is a view of a further modification of the unitary LC variational tuner.

Referring now to the drawings wherein like parts are designated by the same reference characters in all the views, and more particularly to Fig. 1 thereof, there is shown as a preferred embodiment an oscillator circuit for triode vacuum tube 11 having a plate connection 12 and a grid connection 13 integrally engaging the terminals 14, respectively, of the unitary inductance-capacitance variational system generally designated 15. This system for a given setting provides the correct reactance at terminals 14 and hence between the plate and grid of the tube 11 for oscillations to be maintained at a frequency determined by the reactance of the system 15 and the internal tube impedances, the required feedback being supplied by the tube's interelectrode capacitances.

The system 15 comprises approximately semi-circular shaped inductive paths 16, 16′ which lie in a plane and form diametrically opposite gaps 17 and 18. The gap 18 spaces terminals 14 to provide integral continuity between conductors 12 and 13 and the terminal ends of paths 16, 16′ respectively and separates the terminals 14 sufficiently to substantially eliminate stray capacitance effects thereacross. The gap 17 together with stator plates 19, 19′ and rotor 21 form the variable capacitor of the system which is series connected with the inductances 16, 16′. The plates 19, 19′ are approximately sectoral in shape and are electrically and physically joined to the inductance rings 16, 16′, respectively. These plates lie in a plane adjacent to the plane of the inductance rings and are mounted thereon by suitable means such as rivets 24.

The rotor 21 lies in the plane of the paths 16, 16′ and is adapted to be rotated about the axis of shaft 22 which may be of insulating material. When the rotor 21 is in full engagement with capacitor plates 19, 19′ both the capacitance and inductance are at maximum values. As rotor 21 rotates from this maximum position the capacitance and inductance decrease and are minimum when the rotor has completely disengaged the stators 19, 19′ and substantially fills the area between strips 16, 16′. By providing suitable gap spacing and terminals for the tube employed it is apparent that the inductance added by the system 15 when rotor 21 fills the space between strips 16, 16′ is substantially negligible. This oscillating system therefore provides an effective circuit inductance at the high frequency end of the operating range which is not substantially greater than that of the tube electrodes and connections therefrom which pass through the envelope of the tube. Achieving this minimum circuit inductance permits a maximum operating frequency to be attained which may be well above the self-resonant frequency of the tube.

An oscillator designed to operate above and below a tube's self-resonant frequency operates so that at maximum inductance and capacitance the tube 11 oscillates at a frequency below its self-resonant frequency at which a large positive reactance exists at terminals 14. At minimum L and C values the tube oscillates at a frequency above its self-resonant frequency at which a large negative reactance exists across terminals 14. Intermediate frequencies are obtained for intermediate settings of the rotor 21, the setting for the self-resonant frequency of the tube being the series resonance of the tuner at that frequency.

Of course it is well known in the art to optimize the value of bias resistor 23 and to provide low loss, conductive and insulating materials where required. Broadband operation may also require plate and filament chokes with or without shunt damping resistors as shown. Other D. C. feed arrangements known in the art may be utilized than those shown.

Referring now to Fig. 2 there is shown a tuner adapted to receive the plate and grid connectors of a coplanar triode at the terminals 31 and 32, respectively, thereby providing low inductance connections to this type of tube which is designed for coaxial circuit applications. As these tubes are designed for a high self-resonant frequency an oscillator constructed with this tuner can have an extremely high upper frequency limit due to the low residual inductance added by the tuner in disengaged position. Terminals 31 and 32 may be modified, of course, to fit the various requirements of different types of coplanar triode electrodes.

Referring to Fig. 3 the construction of a stacked tuner is shown as would be required to provide the proper inductance and capacitance values in some applications. The inductance is formed by three layers of strips 16, 33, and 34 which are spaced by spacers 35 at the terminal end and by capacitor plates 36 and 37 at the other end. Plates 19 and 38 provide additional capacitance. The three rotor plates 21 are mounted in spaced relation on shaft 22 for rotation therewith. If the maximum inductance of such a system is too small for certain applications the number of rings can be reduced without reducing the number of capacitor and rotor plates thereby providing a high inductance and a high capacitance for the engaged position. For this construction suitable spacers near gap 17 would be required to separate the capacitor plates in lieu of the plurality of inductance rings.

Fig. 4 shows a stacked plate and ring tuner in which the gap 41 separating the tube terminals is at one end of the inductive path. With this construction a low residual capacitance can be obtained for the disengaged position of the rotor since the rotor will effect the full inductance diminution before it bridges the gap 41 provided the proper direction of rotation is chosen. For this purpose the leading edge of the rotor may be cut back, if desired.

The terminal gap could, of course, be at any other intermediate position around the inductance ring. The tuner provides for the dual plate leads at terminals 42 and dual grid leads at 43 of a seven pin "Acorn" triode 44. Connections to the remaining filament and cathode tube terminals can be made and the leads disposed away from the tuner to minimize capacitance effects. A somewhat similar structure would be required if the oscillator tube employed were of conventional pin arrangement such as the miniature 7-pin 6J6 for example. Parallel operation of the two triode units would require a socket mounted with the plate terminals connected on one side of the gap and the grid terminals on the other side.

Fig. 5 shows a modification of the tuner having capacitor stators 51, 52 in opposite quadrants of a circle and the rotor composed of oppositely extending portions 53, 54. The inductance is provided by strips 55, 55′ which are in substantial edge adjacency with one plate 54 of the rotor when in a disengaged position. Terminals 14 are provided as required. This construction provides both L and C continuously variable over the entire tuning range which is covered with a 90° rotation instead of 180° as in the previous embodiments. The portion 53 does not contribute to the inductance reduction in the disengaged position and the edges 56, 57 may be modified if desired to reduce the capacitance to plate 53 in this position.

The maximum capacitance available with any plate construction can be increased by securing a layer of mica shown as 58 of Fig. 5 or other high dielectric material to the rotor plates having a thickness sufficient to substantially fill the gap between rotor and stator plates when in engaged position.

It is obvious that within the teaching of the present invention the stators and inductance strips can be cut as an integral piece from the same metal plate and provide the rotor to rotate in the plane adjacent thereto. In this construction the edge-to-edge adjacency of the rotor and inductance strips in the minimum inductance position is only approximate since the rotor is not in the plane of the strips.

It is also obvious that the circular construction shown in the drawings is not required. Any general pair of plane surfaces disposed in edge adjacency will suffice as stators. In place of the sectoral rotor the rotor can be any general regular shape provided it is pivoted near an edge and that the inductance strips are shaped so as to be substantially bridged thereby in the discharged position. The rotor of Fig. 5 could also be modified from the oppositely extending quadrantal shape without departing from the present teaching.

Although this invention has been disclosed as providing an oscillator circuit for operation over a frequency range both below and above the self-resonant frequency of the tube employed, it will be apparent that the invention is not limited to oscillators having such a range. Operation of the oscillator may be obtained only above or only below the tube's self-resonant frequency, if desired, by limiting the LC variational range in the design of the tuner. It is also apparent that the tuner of the present invention will be useful over a somewhat limited range if employed without providing the contiguous connections between the tube and tuner terminals as described.

While the invention has been described in relation to triode tubes, it is not intended that it should be limited thereby since it is well known that other oscillators such, for example, as the magnetron, require tuning circuits. The tuner also may be used as a reactor in other oscillator circuits or the like. As a particular application of the oscillatory circuit of the invention, the tuner could be incorporated within the envelope of a discharge device directly across the active discharge path, if desired, for example, to obtain the lowest possible residual inductance in the oscillatory circuit.

Many modifications will be apparent in the light of the above teachings and are to be understood as being within the scope of the present invention as set forth in the appended claims.

I claim:

1. A high frequency oscillator comprising a discharge device having at least an electron source, a plate electrode and a control electrode, conductors from said electrodes terminating in spaced relation, a series circuit unitary inductance-capacitance variational tuner including a pair of capacitor stators of generally sectoral shape disposed in adjacent quadrants of a circle, projections from the peripheral portions of said stators into the other quadrants of said circle and terminating in a single gap, the spacing across said gap substantially corresponding to said spaced relation and a movable element adapted for isolated movement parallel to the plane of said circle for capacitive variational relation with said stators and inductive variational relation with said projections, and contactors connected at the gap terminations of said projections contacting with low inductance the terminal portions of said conductors respectively, said tuner substantially eliminating the inductance of said projections connected to said conductors for the high frequency position of said element.

2. The oscillator according to claim 1 wherein said movable element comprises a rotor movable about an axis normal to the plane of said circle.

3. The oscillator according to claim 1 wherein said discharge device is a coplanar triode, said conductors are circular and of substantial diameter, and said contactors are circular-conductor receiving contactors.

4. A series inductance-capacitance variational tuner for a triode oscillator comprising a pair of generally sectoral capacitor stators disposed in adjacent quadrants of a circle, arcuate projections at the peripheral portions of said stators, said projections being disposed in the other quadrants of said circle and terminating in a single gap, the spacing across said gap corresponding to the distance between the external grid and plate electrodes of said triode, a generally semi-circularly shaped rotor isolatedly rotatable about an axis through the center and normal to the plane of said circle, the rotation providing selectively a face-to-face maximum capacitive relation between said rotor and said stators with maximum inductance, a substantially edge-to-edge minimum inductive relation between said rotor and said projections with minimum capacitance and all values intermediate thereof, and a pair of terminals, the free terminus of one of said projections having one of said terminals connected thereto and the free terminus of the other of said projections having the other of said terminals connected thereto, whereby low inductance connections to the projection termini on opposite sides of said gap can be made from the grid and plate electrodes, respectively, of said triode.

5. The tuner according to claim 4 in which said triode is a coplanar triode having circular external grid and plate electrodes and said terminals are circular-electrode receiving contactors.

6. In an oscillator circuit for a tube having at least plate, grid and cathode electrodes a tuner comprising a pair of capacitor surfaces in essentially edge-to-edge adjacency, a single inductive path connected between said surfaces and having a gap therein, the spacing across said gap substantially corresponding to the distance between the external conductors of said tube connected to said grid and plate electrodes, said path being disposed substantially in a plane, a pair of terminals connected to said path at said gap on opposite sides thereof, said terminals connecting to said conductors respectively to include the grid to plate discharge path of said tube serially in said inductive path, and a rotor isolatedly mounted for movement with respect to said surfaces and said path and about an axis normal to said plane, said rotor being adjustably positionable in face opposition to said surfaces or in essentially edge opposition to said path or any position intermediate thereof whereby in the position of said edge opposition the inductance of said path is substantially eliminated.

7. In an oscillator circuit for a tube having at least plate, grid and cathode electrodes a tuner comprising a pair of capacitor surfaces in an essentially edge-to-edge adjacency, a single inductive path connected between said surfaces and having a gap therein, the spacing across said gap substantially corresponding to the distance between the external conductors of said tube connected to said grid and plate electrodes, terminals connected to said path at and on opposite sides of said gap, said terminals connecting to said conductors to include the grid-plate discharge path of said tube serially in said inductive path, and a movable element isolatedly mounted for movement with respect to said surfaces and said path, said element being adjustably positionable in face opposition to said surfaces or in essentially edge opposition to said path or any position intermediate thereof whereby in the position of said edge opposition the inductance of said path is substantially eliminated.

8. An oscillatory arrangement for a device which provides an active discharge path comprising a variable capacitance, a variable inductance, a circuit serially connecting said capacitance, said inductance and said path, said inductance being substantially the total inductance of said circuit, and means selectively movable for varying said capacitance and inductance for maximum capacitive and inductive values, minimum capacitive and inductive values and values intermediate thereof, said movable means reducing the value of said inductance to substantially zero for the minimum setting thereof.

9. A high frequency tuner comprising separate capacitor stators, separate inductive elements connected at one terminal thereof to the separate stators respectively, and having the other terminals thereof terminate in spaced relation to form a gap therebetween, said inductive elements being disposed essentially in a plane, a rotor movable about an axis perpendicular to said plane, said rotor in engaged position having a substantial surface opposed to the stator surfaces and in unengaged position substantially unopposed to said stator surfaces and in peripheral relation to said inductive elements and said gap whereby the tuner may be varied from maximum inductance and capacitance between said other terminals in said engaged position to substantially minimum inductance and capacitance between said other terminals in said unengaged position.

10. A series circuit unitary inductance-capacitance variational tuner comprising a pair of capacitor surfaces in essentially edge-to-edge adjacency, a single inductive path connected between said surfaces and having a gap therein, said path being disposed substantially in a plane, a rotor mounted for isolated movement with respect to said surfaces and said path and about an axis normal to said plane, said rotor being selectively positionable in face opposition to said surfaces or in essentially edge opposition to said path or any position intermediate thereof, the terminals of said tuner being at said gap on opposite sides thereof.

11. A variable series circuit reactor comprising a pair of first capacitor surfaces, separate inductor strips connected at one terminal to respective ones of said capacitor surfaces, the other terminals thereof being spaced from each other to form a gap therebetween, and a second capacitor surface optionally isolatedly positionable in face-to-face opposition to said first surfaces or in substantially edge-to-edge opposition to said strips, or in any proportions of opposition to said surfaces and said strips, the other terminals of said strips constituting the terminals of said reactor.

12. A series circuit variable reactor for ultra high frequencies comprising a pair of first capacitor surfaces, a single inductive path connected between said surfaces and having a gap therein, and a rotor surface adapted isolatedly to rotate in capacitive relation with said first surfaces or in inductive relation with said path or any position intermediate thereof whereby the circuit capacitance and inductance can be varied from maximum to minimum values respectively, the terminals of said reactor being at said gap on opposite sides thereof.

13. A variable reactor for ultra high frequencies comprising a pair of capacitor stators in edge adjacency separated by a gap, a single inductive loop connected between said stators and having a gap therein, said stators and said loop being disposed substantially parallel to a plane, and a rotor adapted isolatedly to rotate parallel to said plane to bridge said first mentioned gap for capacitive relation to said stators and to substantially fill the area bounded by said loop and said second mentioned gap for inductive relation therewith and intermediate positions therebetween, the terminals of said reactor being at said second mentioned gap on opposite sides thereof.

14. A high frequency tuner comprising first and second stator condenser plates of substantially quadrantal shape and disposed in alternate quadrants of a circle, arcuate projections from said plates, said projections being disposed in one of the other quadrants of said circle and terminating in a gap, and a rotor element isolatedly adjustably mounted at the center of said circle and having oppositely extending plates operable to define with said first and second plates and said projections a series circuit having variable inductance and capacitance across said gap as the terminals thereof.

15. A high frequency tuner comprising first and second stator condensor plates of substantially quadrantal shape and disposed in alternate quadrants of a circle, an arcuate projection from one of said plates in one of the other quadrants of said circle, said projection extending toward and terminating in spaced relation to the other of said plates forming a gap therebetween the terminals of said tuner being at said gap on opposite sides thereof, and a rotor element isolatedly adjustably mounted at the center of said circle and having oppositely extending plates operable to define with said first and second plates and said projection a circuit having variable inductance and capacitance between said terminals.

16. A variable reactor for ultra high frequencies comprising a pair of terminals, a pair of capacitor surfaces, an inductive loop serially connecting said surfaces and said terminals, an element movable for capacitive relation with said surfaces and inductive relation with said loop, and a layer of high dielectric constant material on said element to substantially increase the capacitance in said capacitive relation.

17. A variable reactor for ultra high frequencies comprising a pair of capacitor stators in edge adjacency separated by a first gap, a single inductive loop projecting from one of said stators and terminating near the other to form a second gap, said stators and said loop being disposed substantially parallel to a plane, and a substantially semi-circular rotor adapted isolatedly to rotate parallel to said plane about an axis through the circular center thereof to bridge said first gap for capacitive relation to said stators and to substantially fill the area bounded by said loop and said second gap for inductive diminishing relation therewith and intermediate positions therebetween, the terminals of said reactor being at said second mentioned gap on opposite sides thereof.

18. In a high frequency oscillator for tuning a band between a lower and a higher frequency the combination comprising a discharge device having a plate and a control grid with terminals thereof disposed in spaced relation; a series circuit tuner having a split-stator capacitor, inductive loop means connecting said stators but for a single peripheral gap, the spacing across said gap substantially corresponding to said spaced relation, and a conductive element movable without contacting said stators or inductive loop means to alternatively bridge said stators or shield the free area of said inductive loop means to provide at the terminals defined by said gap an appreciable inductance and capacitance at said lower frequency and at said higher frequency a minimum capacitance with substantial elimination of the inductance of said inductive loop means; and connections joining said first mentioned terminals contiguously to said tuner on respective sides of said gap.

19. In a high frequency circuit for tuning a band between a lower and a higher frequency the combination comprising a discharge device with an active discharge path having terminals disposed in spaced relation; a series circuit tuner having a split-stator capacitor, inductive loop means connecting said stators but for a single peripheral gap, the spacing across said gap substantially corresponding to said spaced relation, and a conductive element movable without contacting said stators or inductive loop means to alternatively bridge said stators or shield the free area of said inductive loop means to provide at the terminals defined by said gap an appreciable inductance and capacitance at said lower frequency and at said higher frequency a minimum capacitance with substantial elimination of the inductance of said inductive loop means; and connections joining said first mentioned terminals contiguously to said tuner on respective sides of said gap.

20. A series circuit variable reactor comprising a pair of first capacitor surfaces of substantially quadrantal shape and disposed in adjacent quadrants of a circle, a substantially semi-circular single inductive path connected between said surfaces in the other quadrants of said circle and having a gap therein, and a substantially semi-circular second capacitor surface adapted isolatedly to rotate about the center of said circle in face-to-face opposition to said first surfaces or in substantially edge-to-edge opposition to said path or any position intermediate thereof, the terminals of said circuit being at said gap on opposite sides thereof.

References Cited in the file of this patent

UNITED STATES PATENTS

| | | |
|---|---|---|
| 2,092,069 | Hollman | Sept. 7, 1937 |
| 2,246,928 | Schick | June 24, 1941 |
| 2,367,681 | Karplus et al. | Jan. 23, 1945 |
| 2,453,489 | Bruntil | Nov. 9, 1948 |
| 2,471,705 | Schmitt | May 31, 1949 |
| 2,543,891 | Carlson | Mar. 6, 1951 |
| 2,593,361 | Sziklai | Apr. 15, 1952 |